United States Patent
Kim et al.

(10) Patent No.: US 6,596,558 B2
(45) Date of Patent: Jul. 22, 2003

(54) METHOD FOR FABRICATING OPTICAL DEVICES WITH DEFECTLESS AND ANTIREFLECTING SPOT SIZE CONVERTER

(75) Inventors: Sung Bock Kim, Taejon (KR); Dae Kon Oh, Taejon (KR)

(73) Assignees: Electronics and Telecommunications Research Institute (KR); Korea Telecom (KR)

( * ) Notice: Subject to any disclaimer, the term of this patent is extended or adjusted under 35 U.S.C. 154(b) by 0 days.

(21) Appl. No.: 10/090,552

(22) Filed: Mar. 4, 2002

(65) Prior Publication Data

US 2002/0151095 A1 Oct. 17, 2002

(30) Foreign Application Priority Data

Mar. 5, 2001 (KR) ........................................ 2001-11091

(51) Int. Cl.[7] ............................................... H01L 21/00
(52) U.S. Cl. .......................................... 438/31; 438/41
(58) Field of Search ............................. 438/31, 32, 40, 438/41, 942, 29; 372/43, 45; 385/43, 50

(56) References Cited

U.S. PATENT DOCUMENTS

| 5,910,012 A | * | 6/1999 | Takeuchi et al. |
| 5,985,685 A | * | 11/1999 | Lealman et al. |
| 6,253,009 B1 | * | 6/2001 | Lestra et al. |
| 6,465,269 B2 | * | 10/2002 | Furushima et al. |
| 2002/0039469 A1 | * | 4/2002 | Jeong et al. |
| 2002/0085602 A1 | * | 7/2002 | Park et al. |

* cited by examiner

*Primary Examiner*—Savitri Mulpuri
(74) *Attorney, Agent, or Firm*—Blakely, Sokoloff Taylor & Zafman

(57) ABSTRACT

The present invention relates to a method for fabricating an optical device integrated with a spot size converter to reduce defect and low reflectivity in a butt-joint portion, the method including the steps of: a) depositing a first clad layer, an active layer and a second clad layer sequentially on the (100) plane of a semiconductor substrate; b) forming on the second clad layer a double dielectric mask of which the lower layer has a relatively wider width than that of the upper layer, exposing one side of the second clad layer; c) wet-etching the first clad layer, the active layer and the second clad layer in a buried ridge structure by using the double dielectric mask, and exposing the (111)A plane of the active layer tilted towards the (100) plane by a predetermined angle; d) growing a spot size conversion region on the (111)A plane of the active layer; and e) removing the double dielectric mask.

7 Claims, 5 Drawing Sheets

METHOD FOR FABRICATING OPTICAL DEVICES WITH DEFECTLESS AND ANTIREFLECTING SPOT SIZE CONVERTER

FIELD OF THE INVENTION

The present invention relates to an optical device; and, more particularly, to a method for fabricating an optical device integrated with a spot size converter capable of coupling an optical device with optical fibers without any lenses in a transmission module for an optical fiber communication.

DESCRIPTION OF RELATED ART

Generally, after manufacturing of an optical device, such as a semiconductor layer diode (LD) or a semiconductor optical amplifier (SOA), optical fibers are coupled at ends of the optical devices, thereby being formed into a type of a module. In this case, to obtain high coupling efficiency, complicated optical instruments should be used, which leads to high production cost and complex production process.

In particular, to use a laser diode (LD) for communication as a common optical device, it is necessary to bring down the cost of a transmission module. Therefore, a method coupling a complicated optical instrument such as a lens with optical fibers is not efficient because it raises the production cost. Besides, it has a difficulty in controlling the position of the lens.

Also, when the both sides of an active layer have a predetermined reflectivity, an optical ray comes to feedback and as a result of it, the performance of the semiconductor optical amplifier (SOA), which has been in the spotlight as an alternative to a conventional Erbium doped fiber amplifier (EDFA), is deteriorated.

Accordingly, when a laser diode or a semiconductor optical amplifier is fabricated and integrated into a module, a spot size converter (SSC) made of a tapered waveguide through selective growth is integrated at the front end of the laser diode, or at both ends of the semiconductor optical amplifier to improve the coupling efficiency with optical fibers.

A conventional semiconductor waveguide is very small in size and has a big difference from a clad layer in the refraction index, so the spot size is relatively small compared to optical fibers. This small spot size is given a large radiation angle when it comes out, and such that the coupling loss with optical fiber becomes very large.

To solve this problem, a tapered region is formed in a predetermined area of a device and far-field angle is reduced by converting spot size. This way, it becomes possible to connect optical fibers highly efficiently without any extra optical instruments. Additionally, it enhances the effect of a spot size converter further lowering the reflectivity by a tilted waveguide.

In fabricating the spot size converter, the core technology is to connect the optical device with optical fibers by narrowing the radiation angle of a ray coming out of the optical device, and for this, a tapered waveguide is required.

The tapered waveguide can be embodied by controlling its thickness of the waveguide over 3:1 through a selective regrowth process. The selective regrowth process inevitably forms a butt-joint portion BJ. Especially, in case of the SOA, the amplifier cannot perform its role as an amplifier when a reflection is made in the butt-joint portion. Therefore, the antireflecting connection should be performed necessarily.

Recently coming up as important technologies are a method that overcomes the strain caused by the selective growth which has thickness difference of over 3:1 in case of applying an SSC to an optical device and forms a quality optical waveguide, and a method minimizing reflectivity in the butt-joint portion.

In other words, the coupling efficiency with optical fibers should be heightened with a radiation angle of more or less 10°, and the reflectivity should be made very low in the connection region, i.e., butt-joint portion. Particularly, a junction plane should be formed tilted to reduce the reflectivity, but there is a problem that the regrowth is performed on a surface whose crystal plane is not exposed clearly.

Consequently, with this method, an undesired defect is caused, and because the quality of the layer makes a remarkable drop, it is hard to achieve the goal of lowering reflectivity. Moreover, the process is not reproducible.

FIG. 1A is a plane figure showing a laser diode with a vertically tapered spot size converter in accordance with a conventional method, and FIG. 1B is a cross-sectional view of FIG. 1A cut along the line I–I'.

Referring to FIGS. 1A and 1B, after growing an n-InP clad layer 12 on an n-InP substrate 11, an active layer 13 of an InGaAsP/InGaAsP multi quantum well structure is grown on the n-InP clad layer 12, and on the active layer 13, a p-InP clad layer 14 is grown. Subsequently, a photolithography etching is performed to define the width of the active layer 13 around 1 $\mu$m. Then, a mask 15 for selective growth is formed on the etched active layer through a photolithography etching method, and dry- or wet-etching is carried out with the mask 15 for selective growth so as to expose the (011) plane or (0-1-1) plane of the active layer.

Subsequently, a vertically tapered spot size conversion region 16 is formed by using a selective growth method according to the migration of a material gas injected into the mask 15 for selective growth in a metal organic chemical vapor deposition (MOCVD). In the conventional method, the mask 15 for the selective growth that can control the growth difference over 3:1 to have the spot size conversion region 16 vertically tapered. However, as a defect is caused in the butt-joint portion 17 by the vertical tapering, the light coming from the active layer 14 is not transmitted to the spot size conversion region 16 and partly reflected. Due to the reflection in the butt-joint portion 17, the light goes back to the optical device and oscillates a laser, thus canceling the function of the amplifier.

To suppress the reflection in the butt-joint portion and solve the problem, a method was suggested that the butt-joint portion is made tilted to change the direction of the reflection light different from a resonator not to oscillate a laser.

FIG. 1C illustrates the butt-joint portion BJ, the junction plane of the active layer of a multi quantum well (MQW) structure and the spot size conversion (SSC) region, being vertically tapered with a plane slanted towards the vertical at a predetermined angle θ.

FIG. 2 is a perspective view showing a laser diode with a horizontally tapered spot size converter in accordance with another conventional method.

However, there is a limit in reducing defects during the regrowth in the butt-joint portion BJ, that is, a (011) or (0-1-1) plane where the MQW active layer is exposed. In particular, it is very hard to control the growth condition, because the SSC should be regrown in a plane of the butt-joint portion whose crystal plane is not exposed clearly.

There is an advantage of no use of regrowth technique for spot size converter. However, the fine etching technique is necessary to form the very sharp tip for narrower radiation angle. It is very difficult to reproduce the horizontally tapered spot size converter

SUMMARY OF THE INVENTION

It is, therefore, an object of the present invention to provide a method for fabricating an optical device equipped with a spot size converter which can effectively lower reflectivity on the interface between the active layer and the spot size converter, and prevent defect from occurring during the regrowth.

In accordance with an embodiment of the present invention, there is provided a method for fabricating an optical device integrated with a spot size converter, comprising the steps of: a) depositing a first clad layer, an active layer and a second clad layer sequentially on the (100) plane of a semiconductor substrate; b) forming on the second clad layer a double dielectric mask of which the lower layer has a relatively wider width than that of the upper layer, exposing one side of the second clad layer; c) wet-etching the first clad layer, the active layer and the second clad layer in a buried ridge structure by using the double dielectric mask, and exposing the (111)A plane of the active layer tilted towards the (100) plane by a predetermined angle; d) growing a spot size conversion region on the (111)A plane of the active layer; and e) removing the double dielectric mask.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1A:
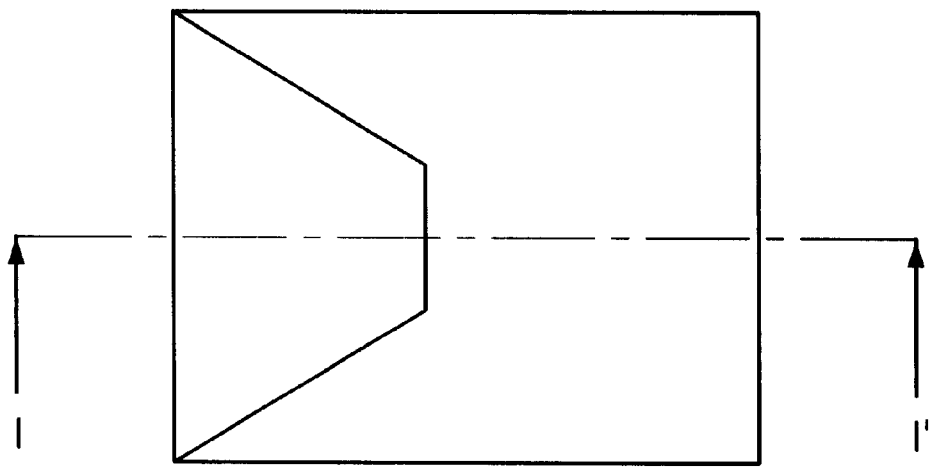
FIGS. 1A to 1C are cross-sectional views illustrating an optical device integrated with a vertically tapered spot size converter in accordance with a conventional method.
Figure 1B:
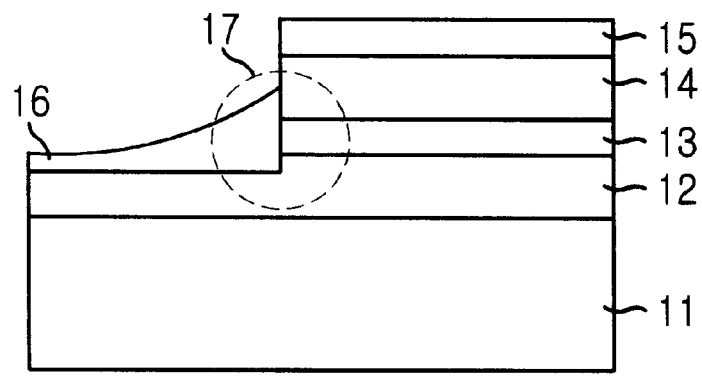
Figure 1C:
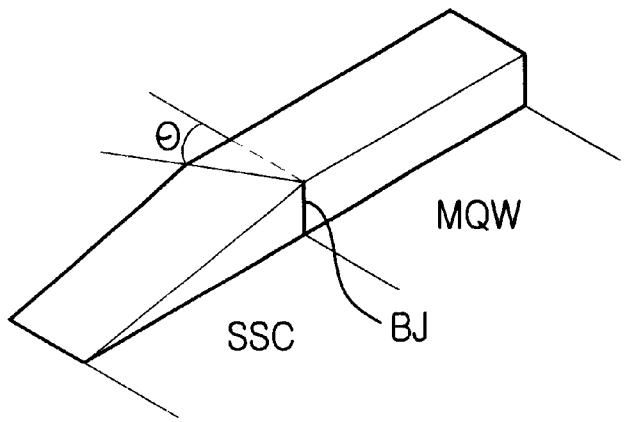
Figure 2:
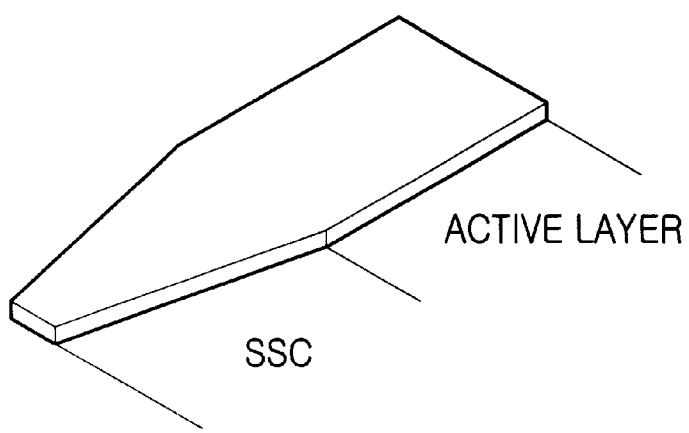
FIG. 2 is a perspective view showing an optical device with a horizontally tapered spot size converter in accordance with another conventional method.
Figure 3A:
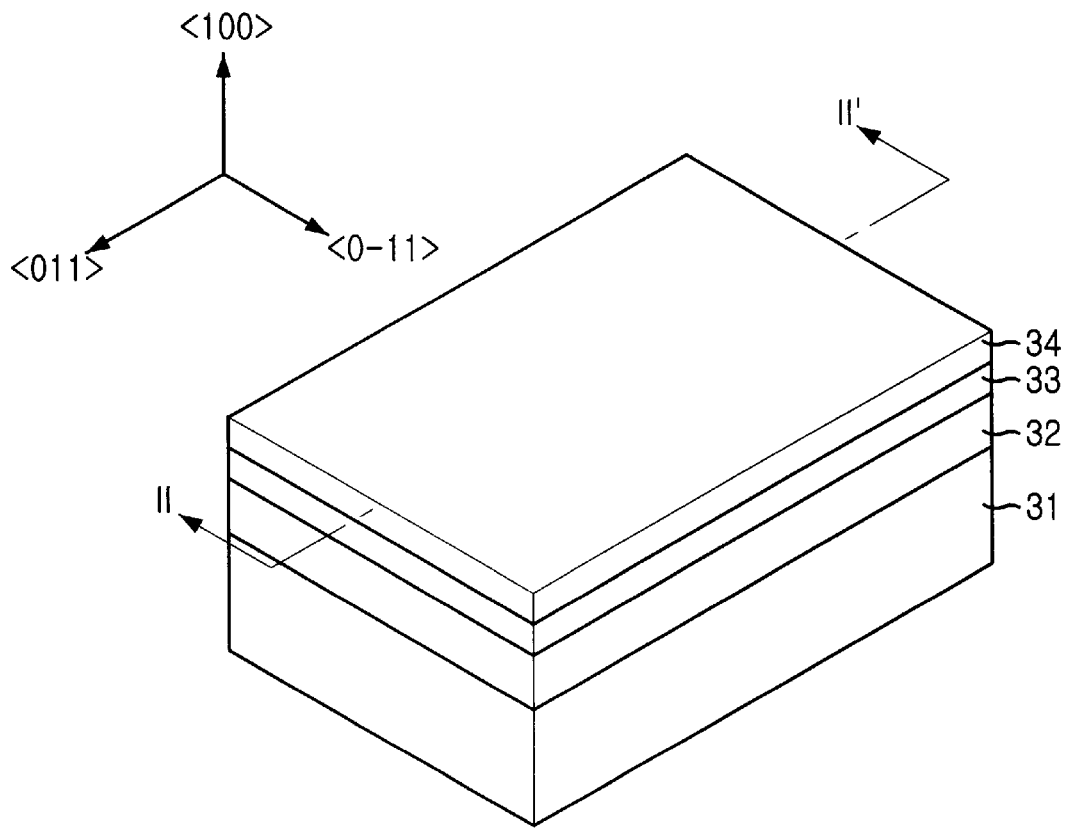
FIGS. 3A to 3F are views depicting a method for fabricating an optical device integrated with a spot size converter in accordance with an embodiment of the present invention.
Figure 3B:
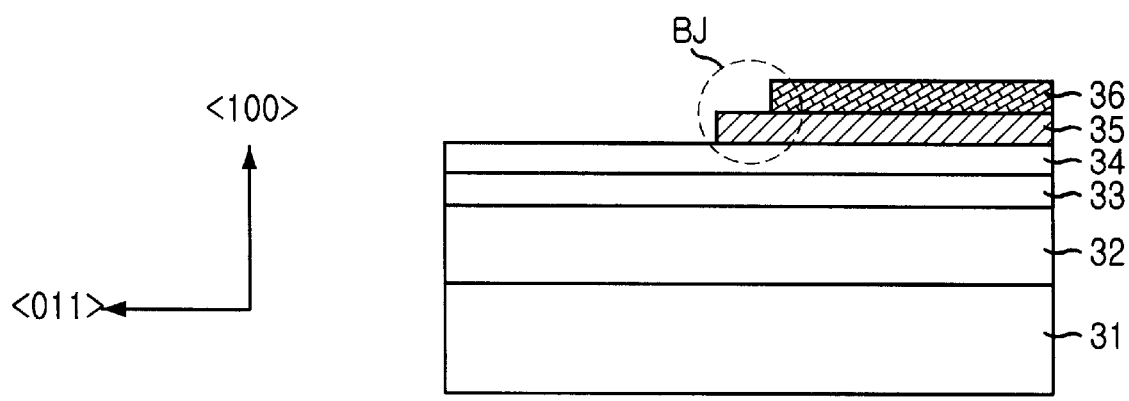
Figure 3C:
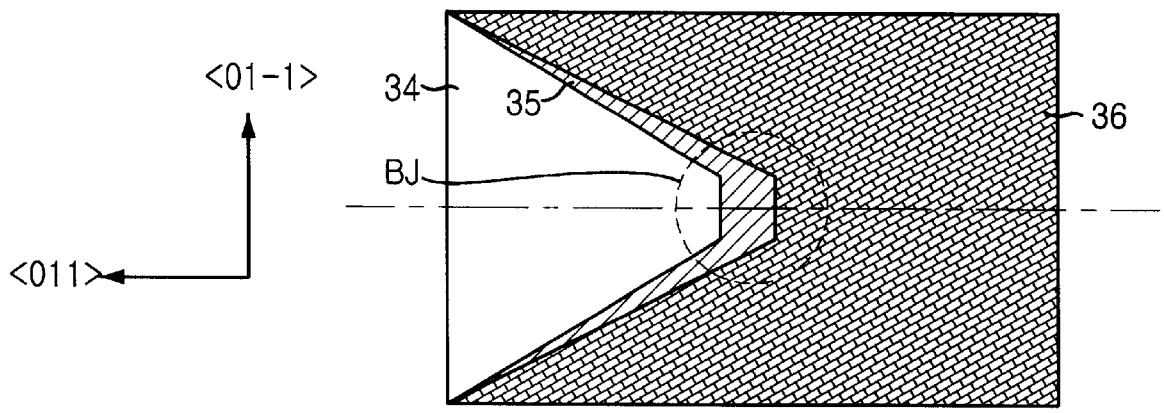

FIGS. 3A to 3F are views depicting a method for fabricating an optical device integrated with a spot size converter in accordance with an embodiment of the present invention. FIG. 3A is a schematic view of the optical device, and FIG. 3C is a plane figure of FIG. 3B. FIGS. 3B and 3D to 3F are cross-sectional views of FIG. 3A cut along the line II–II'.

Referring to FIG. 3A, after an n-InP clad layer 32 is formed on an n-InP substrate 31, an active layer 33 of an InGaAsP/InGaAsP multi quantum well structure is grown on the n-InP clad layer 32, and then a p-InP clad layer 34 is formed on the active layer 33.

FIG. 3A is a schematic view in which the directions <011>, <0-11> and <100> are illustrated. The n-InP clad layer 32, the active layer 33 of an InGaAsP/InGaAsP multi quantum well structure and the p-InP clad layer 34 are grown on the (100) plane of the n-InP substrate 31.

FIG. 3B shows a cross-sectional view of FIG. 3A cut along the line II–II'. To form a mask without an overhang on the upper part of the (111) plane, $SiO_2$ and $Si_3N_4$ are deposited sequentially on the p-InP clad layer 34, and then a $SiO_2$ mask 35 and a $Si_3N_4$ mask 36 are formed through a photolithography etching process. Here, the $SiO_2$ mask 35 and the $Si_3N_4$ mask 36 are deposited in the butt-joint portion BJ with a predetermined width difference, and the width of the $SiO_2$ mask 35 is relatively thicker than that of the $Si_3N_4$ mask 36.

FIG. 3C is a plane figure of FIG. 3B. The $SiO_2$ mask 35 and the $Si_3N_4$ mask 36 are formed with narrow opening part and wide opening part. The width of the opening increases as it goes from the butt-joint portion BJ towards the spot size conversion region C. The increasing opening width is to form a vertically tapered spot size converter through selective growth.

Also, the width of the $SiO_2$ mask 35 is formed wider than that of the $Si_3N_4$ mask 36 by a predetermined width in the butt-joint portion BJ, and the width difference between the $SiO_2$ mask 35 and the $Si_3N_4$ mask 36 decreases as it goes towards the spot size conversion region C until the width of the two becomes the same.

Figure 3D:
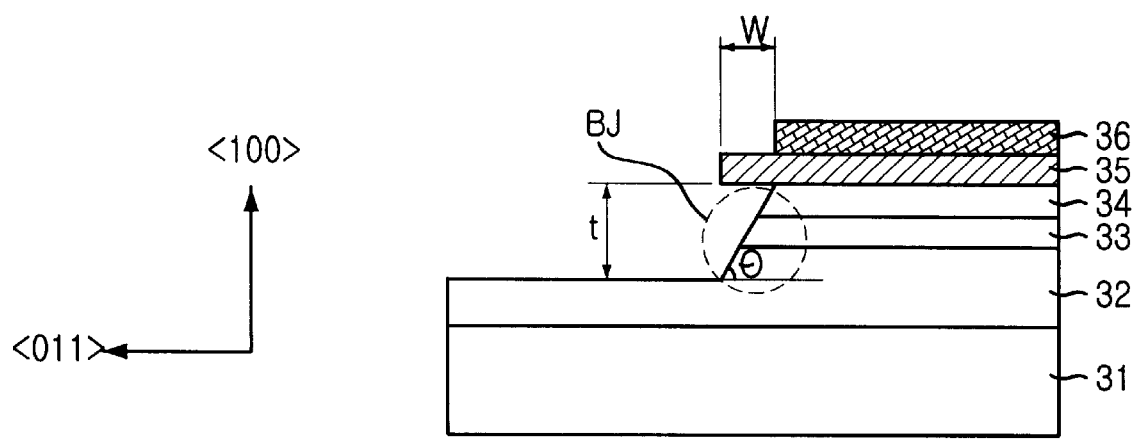

Referring to FIG. 3D, the (111)A plane of the active layer 33 is exposed by using a double mask in which the $SiO_2$ mask 35 and the $Si_3N_4$ mask 36 are stacked and etching the butt-joint portion BJ with a selective wet etching solution. In short, the (111)A plane tilted to the (100) plane of a semiconductor substrate 31, the horizontal plane, by a predetermined angle θ.

Here, since the angle θ between the (111)A plane and the (100) plane is 55°, the relation between the etching thickness t and the width difference w of the $SiO_2$ mask 35 and the $Si_3N_4$ mask 36 can be expressed by an equation (1) as follows.

$$\tan(\theta) = t/w,$$
$$w = t/\tan(\theta), \qquad\qquad \text{Eq.(1)}$$
$$w = 0.7t$$

For instance, when the etching thickness t is set to be 0.5 μm, the $Si_3N_4$ mask 36 is made around 0.35 μm narrower than the $SiO_2$ mask 35 in the butt-joint portion.

Figure 3E:
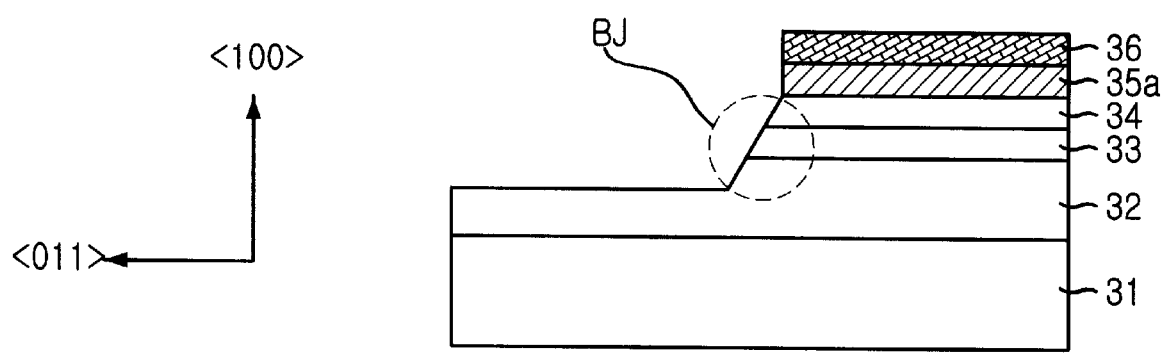

Referring to FIG. 3E, the overhang part of the $SiO_2$ mask 35 is removed by using a BOE (buffered oxide etchent) etching solution that can etch the $SiO_2$ mask 35 selectively against the $Si_3N_4$ mask 36. Here, the reference numeral 35A denotes the $SiO_2$ mask whose overhang has been removed.

Consequently, the (111)A plane of the active layer without an overhang in the butt-joint portion BJ is exposed.

Figure 3F:
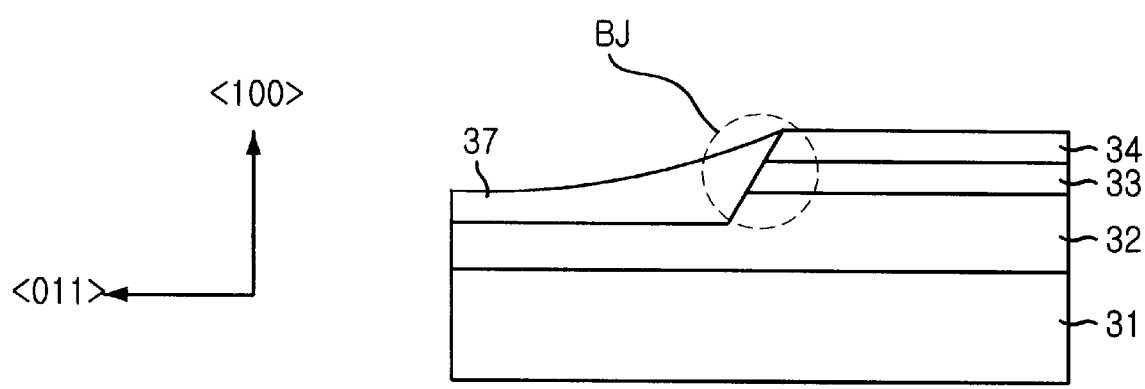

As depicted in FIG. 3F, a vertically tapered spot size conversion region 37 of InGaAsP is formed on the (111)A plane of the exposed active layer through selective growth, and the $SiO_2$ mask 35 and the $Si_3N_4$ mask 36 are removed. Here, the spot size conversion region 37 is grown in a buried ridge structure.

As described above, in this embodiment of the present invention, the butt-joint portion BJ is etched to expose the (111)A plane, so the slant junction plane is exposed as a clear crystal plane. At the same time, with the slant junction plane, a high-quality, defectless and antireflecting spot size conversion region can be formed.

Meanwhile, the angle of the junction plane tilted towards the (111)A plane is around 55°, and it is thought to have more losses than a junction plane tilted at 7~10°. However, as Itaya et al. teach in an article, "Improvement of spectrum characteristics in sport-size converter integrated lasers with tilted butt joint portion", Semiconductor laser Conf., 15$^{th}$ IEEE International, pp. 67~68, 1996, that the coupling efficiency is very excellent on a 45° slanted junction plane. Therefore, the coupling efficiency will not be degraded when an embodiment of the present invention is applied. For reference, according to Itaya, since a vertically tilted butt-joint is formed through an etching process, almost antireflecting butt-joint can be embodied.

However, the spot-size converter of Itaya's paper is different from this invention in that it has a problem of low reproducibility in regrowth procedure, because the butt-joint is made vertically tilted to fall reflectivity and thus it is not exposed with a predetermined crystal plane.

Since a (111)A plane which is very stable in a unsymmetrical wet etching process is used as a growing plane of the butt-joint, instead of the (0-1-1) plane and the (011) plane used for a butt-joint portion BJ in a conventional spot size converter, a defectless and vertically tapered spot size converter can be fabricated. In addition, as it has an antireflecting property that does not send the reflection on the interface from the (111)A plane to the resonancer and diffuses it, it is very useful in coupling reflectivity-sensitive devices such as semiconductor optical amplifiers.

As described above, the present invention fabricates a spot size converter which is defectless and antireflecting in the butt-joint portion by using the (111) plane of the active layer as a growth plane of the butt-joint portion and removing an overhang during the formation of a mask. Also, this invention provides a defectless and antireflecting spot size converter that can substitute complicated optical instruments in all optical devices connected with optical fibers such as laser diodes as well semiconductor optical amplifiers, which are reflectivity-sensitive.

While the present invention has been described with respect to certain preferred embodiments, it will be apparent to those skilled in the art that various changes and modifications may be made without departing from the scope of the invention as defined in the following claims.

What is claimed is:

1. A method for fabricating an optical device integrated with a spot size converter, comprising the steps of:
    a) depositing a first clad layer, an active layer and a second clad layer sequentially on the (100) plane of a semiconductor substrate;
    b) forming on the second clad layer, a double dielectric mask including a lower mask and an upper mask, the lower mask having a relatively wider width than that of the upper mask, exposing one side of the second clad layer;
    c) wet-etching the first clad layer, the active layer and the second clad layer in a buried ridge structure by using the double dielectric mask, and exposing the (111)A plane of the active layer tilted towards the (100) plane;
    d) growing a spot size conversion region on the (111)A plane of the active layer; and
    e) removing the double dielectric mask.

2. The method as recited in claim 1, wherein the step of b) forming a double dielectric mask includes the steps of:
    b-1) depositing $SiO_2$ and $Si_3N_4$ sequentially on the second clad layer;
    b-2) forming a $Si_3N_4$ mask that exposes a side of the second clad layer by etching the $Si_3N_4$ selectively; and
    b-3) forming a $Si_3N_4$ mask having a width as narrow as a predetermined width w from one side of the $SiO_2$ mask by etching the $SiO_2$ selectively.

3. The method as recited in claim 1, wherein the width difference w of the double dielectric mask is controlled by an etching thickness t of the first clad layer, the active layer and the second clad layer, and an angle θ between the (111) plane and the (100) plane of the active layer, which is expressed as:

$$w = \frac{t}{\tan\theta}.$$

4. The method as recited in claim 1, wherein the (111)A plane is tilted towards the (100) plane by the angle of 55°.

5. The method as recited in claim 1, further including a step of removing an overhang portion of the lower mask exposed in the lower part of the upper mask among the double dielectric mask, before growing the spot size region.

6. The method as recited in claim 5, wherein the step of removing an overhang portion of the lower mask is carried out with a BOE solution.

7. The method as recited in claim 1, wherein the spot size conversion region includes InGaAsP and is formed vertically tapered.

* * * * *